United States Patent
Codding et al.

(10) Patent No.: US 8,034,718 B2
(45) Date of Patent: Oct. 11, 2011

(54) METHOD TO RECOVER PATTERNED SEMICONDUCTOR WAFERS FOR REWORK

(75) Inventors: Steven R. Codding, Underhill Center, VT (US); David Domina, Cambridge, VT (US); James L. Hardy, Jr., Essex Junction, VT (US); Timothy C. Krywanczyk, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 909 days.

(21) Appl. No.: 12/031,726

(22) Filed: Feb. 15, 2008

(65) Prior Publication Data

US 2008/0138989 A1 Jun. 12, 2008

Related U.S. Application Data

(63) Continuation-in-part of application No. 11/609,573, filed on Dec. 12, 2006, now Pat. No. 7,666,689, and a continuation-in-part of application No. 11/623,354, filed on Jan. 16, 2007, now Pat. No. 7,700,488.

(51) Int. Cl.
*H01L 21/302* (2006.01)
(52) U.S. Cl. ............. 438/692; 438/691; 216/88; 451/38
(58) Field of Classification Search ............. 438/691, 438/692, 693; 216/88, 89, 90; 451/28, 38
See application file for complete search history.

(56) References Cited

U.S. PATENT DOCUMENTS

| | | | |
|---|---|---|---|
| 4,738,056 A * | 4/1988 | Suzuki | 451/78 |
| 6,010,956 A * | 1/2000 | Takiguchi et al. | 438/623 |
| 6,406,923 B1 | 6/2002 | Inoue et al. | |
| 6,673,522 B2 | 1/2004 | Kim et al. | |
| 6,752,694 B2 | 6/2004 | Schneegans et al. | |
| 6,917,433 B2 | 7/2005 | Levy et al. | |
| 7,037,854 B2 | 5/2006 | Bachrach et al. | |
| 7,083,824 B2 | 8/2006 | Stankowski et al. | |
| 7,615,470 B2 * | 11/2009 | Kim et al. | 438/471 |
| 2001/0018242 A1 * | 8/2001 | Kramer et al. | 438/200 |
| 2003/0047710 A1 * | 3/2003 | Babu et al. | 252/79.1 |

FOREIGN PATENT DOCUMENTS

| | | |
|---|---|---|
| JP | 61159371 A | 7/1986 |
| JP | 8279514 A | 10/1996 |
| JP | 9237771 A | 9/1997 |
| JP | 10308398 A | 11/1998 |
| JP | 2001237201 A | 8/2001 |

OTHER PUBLICATIONS

U.S. Appl. No. 11/609,573, Codding, et al., Pending.
U.S. Appl. No. 11/623,354, Codding, et al., Pending.

\* cited by examiner

*Primary Examiner* — Lan Vinh
(74) *Attorney, Agent, or Firm* — Gibb I.P. Law Firm, LLC

(57) ABSTRACT

Disclosed are embodiments of a method of removing patterned circuit structures from the surface of a semiconductor wafer. The method embodiments comprise blasting the surface of the semiconductor wafer with particles so as to remove substantially all of the patterned circuit structures. The blasting process is followed by one or more grinding, polishing and/or cleaning processes to remove any remaining circuit structures, to remove any lattice damage and/or to achieve a desired smoothness across the surface of the semiconductor wafer.

20 Claims, 6 Drawing Sheets

METHOD TO RECOVER PATTERNED SEMICONDUCTOR WAFERS FOR REWORK

CROSS-REFERENCE TO RELATED APPLICATIONS

The present invention claims the benefit under 35 U.S.C. §120 as a continuation-in-part of presently U.S. patent application Ser. No. 11/609,573 entitled "METHOD TO REMOVE CIRCUIT PATTERNS FROM A WAFER", filed on Dec. 12, 2006 now U.S. Pat. No. 7,666,689, the entire teachings of which are incorporated herein by reference. The present invention also claims the benefit under 35 U.S.C. §120 as a continuation-in-part of presently U.S. patent application Ser. No. 11/623,354, entitled "RECYCLING OF ION IMPLANTATION MONITOR WAFERS", filed on Jan. 16, 2007 now U.S. Pat. No. 7,700,488, the entire teachings of which are incorporated herein by reference

BACKGROUND

1. Field of the Invention

The embodiments of the invention generally relate to the reuse of previously processed semiconductor wafers and, more particularly, to an improved process for removing patterned circuit structures from the surface of semiconductor wafers so that the semiconductor wafers may subsequently be reused (i.e., recycled, reworked, etc.).

2. Description of the Related Art

One issue associated with the reuse (i.e., recycle, rework, etc.) of previously processed semiconductor wafers is that the circuit patterns on the semiconductor wafers may be proprietary. Thus, the circuit patterns should be removed prior to sending the wafers out to vendors for recycling, rework, etc. Unfortunately, current solutions for removing such circuit patterns are typically costly and/or produce a sub-quality product. Therefore, there is a need in the art for an improved process for removing patterned circuit structures from the surface of semiconductor wafers so that the semiconductor wafers may subsequently be reused (i.e., recycled, reworked, etc.).

SUMMARY

In view of the foregoing, disclosed herein are embodiments of a method of removing patterned circuit structures from the surface of a semiconductor wafer. The method embodiments comprise blasting the surface of the semiconductor wafer with particles so as to remove substantially all of the patterned circuit structures. The particle blasting process is followed by one or more optional grinding, polishing and/or cleaning processes to remove any remaining circuit structures, to remove any lattice damage resulting from grinding and/or particle blasting, and/or to achieve a desired smoothness across the surface of the semiconductor wafer.

More particularly, the embodiments of the method comprise providing a semiconductor wafer having a surface with patterned circuit structures. This semiconductor wafer can comprise a wafer that was previously used as a manufacturing control tool. Next, this semiconductor wafer can be held by a particle blasting tool and, using the particle blasting tool, particles (e.g., particles of aluminum oxide, silicon oxide, cerium, and/or a plastic with a size equal to or less than 3 microns) can be directed, using a predetermined nozzle angle and predetermined particle velocity, toward the patterned circuit structures on the wafer surface. That is, the process of directing the particles toward the patterned circuit structures on the wafer surface can be controlled such that the particles contact the patterned circuit structures with a predetermined velocity from a predetermined angle and, thereby remove substantially all of the patterned circuit structures from the wafer surface. After the particles are directed at the patterned circuit structures on the wafer surface (i.e., after the patterned circuit structures are substantially all removed), the processing can stop or, alternatively, the wafer surface can undergo further grinding, polishing and/or cleaning processes.

For example, a fine grinding process can be performed on the wafer surface so as to remove any lattice damage that may have resulted when the particles were directed toward the semiconductor wafer surface (i.e., to remove lattice damage caused by the particle blasting process). This fine grinding can further be performed so that a desired surface smoothness is achieved. That is, the fine grinding can be performed so that the maximum roughness height of the wafer surface does not exceed a predetermined value.

Alternatively, or in addition to the grinding process, a polishing process can be performed. In an exemplary polishing process, a chemical mechanical polishing (CMP) apparatus with a polishing wheel can be used. A slurry containing an abrasive material is added to the space between the semiconductor wafer and the polishing wheel. A basic solution (e.g., a solution having a pH value of approximately ten) is also added to this space. In operation, the abrasive material removes material from the surface of the semiconductor wafer and the basic material helps dissolve the removed material. As with fine grinding, this polishing process can also be performed so that a desired smoothness is achieved (i.e., so that the maximum roughness height of the surface does not exceed a predetermined value).

Due to the nature of polishing over grinding, polishing processes can be used to achieve greater levels of smoothness. Thus, if a combination of fine grinding and polishing processes are used, then the fine grinding can be performed until the maximum roughness of the wafer surface does not exceed a predetermined first value and the polishing can be performed, after the fine grinding, so that the maximum roughness does not exceed a predetermined second value that is less than the first value.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of these embodiments without departing from the spirit thereof, and these embodiments include all such changes and modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
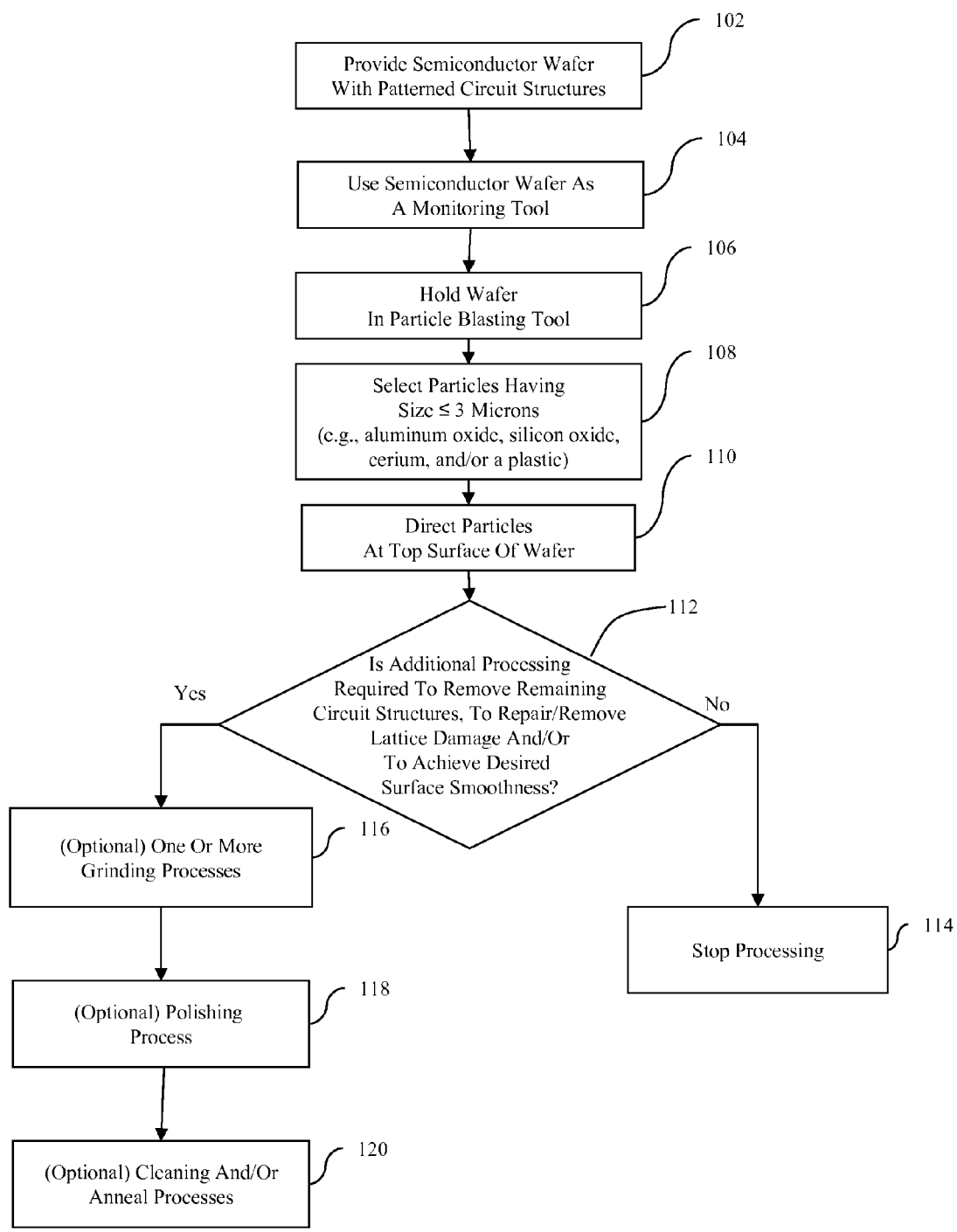
FIG. 1 is a flow diagram illustrating an embodiment of the method.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

One issue associated with the reuse (i.e., recycle, rework, etc.) of previously processed semiconductor wafers is that the circuit patterns on the semiconductor wafers may be proprietary. Thus, the circuit patterns should be removed prior to sending the wafers out to vendors for recycling, rework, etc. Unfortunately, current solutions for removing such circuit patterns are typically costly and/or produce a sub-quality product.

For example, one known solution for removing such circuit patterns from previously processed semiconductor wafers is a wet bath process, during which the semiconductor wafer is exposed to one or more etchants, such as, HF, $HNO_3$, $H_2O_2$, S, P or HCL. This wet bath process effectively removes all films from the semiconductor wafer and, thereby removes all circuit patterns. Unfortunately, the wet bath process also often results in significant bulk semiconductor (e.g., bulk silicon) substrate removal and non-uniform etch spots. Consequently, the resulting semiconductor wafer product exhibits a highly stressed and fragile lattice. Finally, the wet bath process is cost prohibitive due to the cost of the dedicated wet tank that is needed, the cost of the chemicals that are needed, and the cost of required chemical disposal.

Another known solution for removing such circuit patterns from previously processed semiconductor wafers is a layer-by-layer removal process. In such a removal process, each layer is removed (one at a time) using a specific wet chemistry combined with dry etching. The layer-by-layer removal process can minimize substrate damage. Unfortunately, it can still cause lattice damage, which in turn can cause breakage and/or require post-processing polishing. Finally, the layer-by-layer removal process is also cost-prohibitive (e.g., due to the required tools) as well as time-consuming and labor intensive.

In view of the foregoing, disclosed herein are embodiments of a method of removing patterned circuit structures from the surface of a semiconductor wafer. The method embodiments comprise blasting the surface of the semiconductor wafer with particles so as to remove substantially all of the patterned circuit structures. This can be accomplished, for example, as illustrated and described in presently pending U.S. patent application Ser. No. 11/609,573 entitled "METHOD TO REMOVE CIRCUIT PATTERNS FROM A WAFER", the entire teachings of which are incorporated herein by reference. U.S. patent application Ser. No. 11/609,573 was filed on Dec. 12, 2006 by the inventors of the present invention and is assigned to the same assignee as the present invention. The particle blasting process can be followed by additional processing, including but not limited to, one or more grinding, polishing and/or cleaning processes to remove any remaining circuit structures, to remove any lattice damage resulting from grinding and/or particle blasting, and/or to achieve a desired smoothness across the surface of the semiconductor wafer. This additional processing can be accomplished, for example, as illustrated and described in presently pending U.S. patent application Ser. No. 11/623,354, entitled "RECYCLING OF ION IMPLANTATION MONITOR WAFERS", the entire teachings of which are incorporated herein by reference. U.S. patent application Ser. No. 11/623,354 was filed on Jan. 16, 2007 by multiple inventors, including two of the inventors of the present invention, and is assigned to the same assignee as the present invention.

Figure 2:
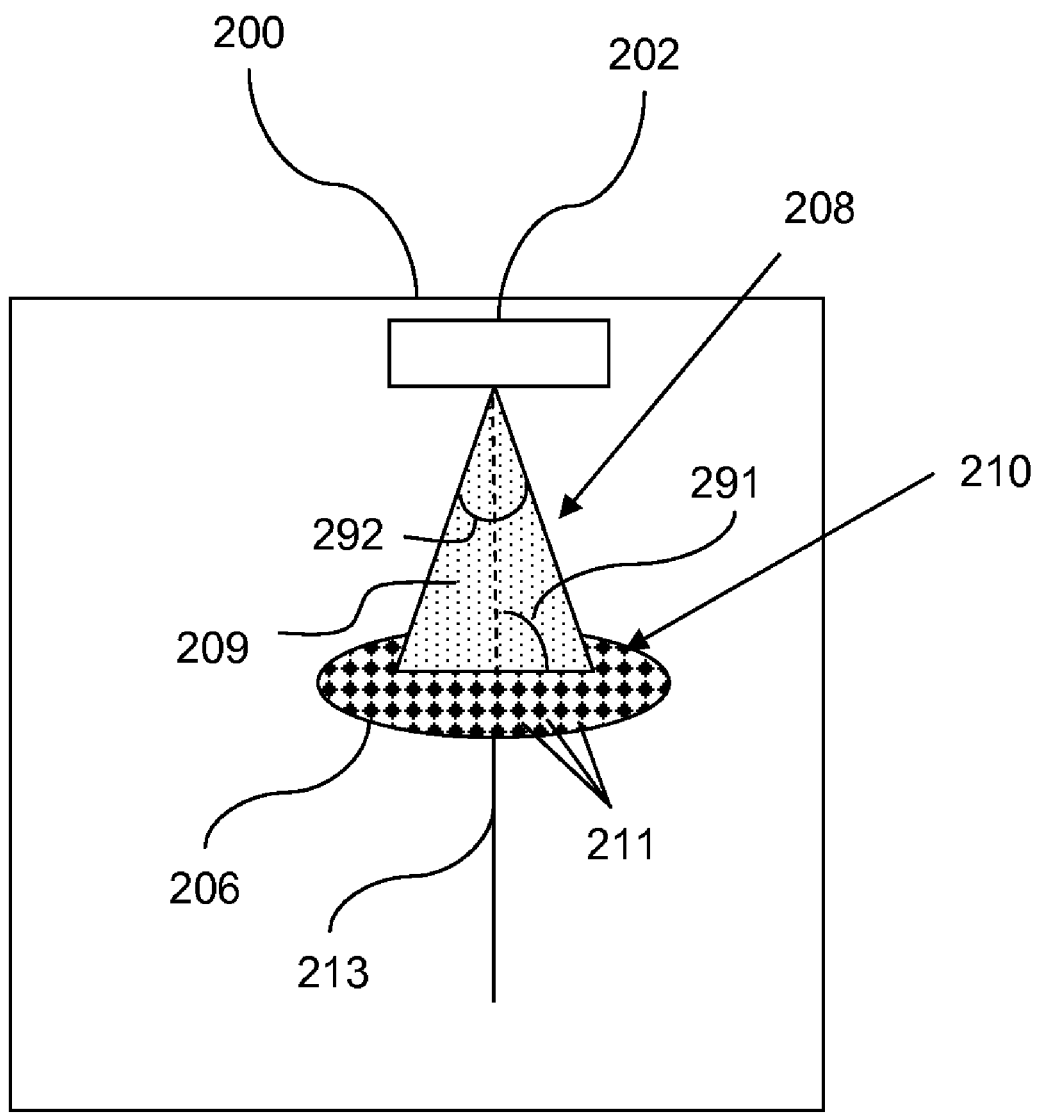
FIG. 2 is a diagram illustrating an exemplary particle blasting tool that can be used to perform process 110 of FIG. 1.

More particularly, referring to the flow diagram of FIG. 1 in combination with the blasting tool diagram of FIG. 2, the embodiments of the method of the present invention comprise providing a semiconductor wafer 206 having a wafer surface 210 with patterned circuit structures 211 (102). This provided semiconductor wafer 206 can comprise a semiconductor wafer that was previously used as a manufacturing control tool (104). Next, this semiconductor wafer 206 can be held by a particle blasting tool 200 (104) and, using the particle blasting tool, selected particles 209 (e.g., particles of aluminum oxide, silicon oxide, cerium, and/or a plastic with a size equal to or less than 3 microns) can be directed, using a predetermined nozzle angle 291 (i.e., angle of the particle blasting nozzle relative the wafer) and predetermined particle velocity, in a stream 208 toward the semiconductor wafer 206 and, specifically, at the patterned circuit structures 211 on the wafer surface 210 in order to remove those structures 211 (108-110). That is, during the process of directing the particles at the wafer surface 210 (at process 110), the stream 208 can be controlled such that the particles contact the patterned circuit structures 211 with a predetermined velocity and from a predetermined angle 291, thereby removing substantially all of the patterned circuit structures 211 from the wafer surface 210. In one embodiment the stream 208 can further be controlled such that it is a broad stream (i.e., a wide spray angle 292), which covers the entire surface 210 of the semiconductor wafer 206, and thereby uniformly distributes the particle blast across the wafer surface 210. In another embodiment (not shown), the stream 208 can be controlled such that it is a narrow stream (i.e., narrow spray angle 292), which covers only a portion of the surface 210 of the semiconductor wafer 206. In this embodiment, the position of the stream 208 relative to the semiconductor wafer 206 would be shifted and controlled such that the particle blast is uniformly distributed across the wafer surface 210.

After the particles 209 are directed at the patterned circuit structures 211 on the wafer surface 210 (i.e., after the patterned circuit structures 211 are substantially all removed), processing can stop (114), as described in the embodiments of the present invention detailed in U.S. patent application Ser. No. 11/609,573. Alternatively, after the particles 209 are directed at the patterned circuit structures 211 on the wafer surface 210 (i.e., after the patterned circuit structures 211 are substantially all removed), the wafer surface 210 can undergo further processing, including but not limited to, grinding, polishing and/or cleaning processes (116-120).

Specifically, referring again to FIGS. 1 and 2 in combination, U.S. patent application Ser. No. 11/609,573 details embodiments of the present invention, wherein processing stops immediately after the patterned circuit structures 211 are substantially removed from the wafer surface 210. Specifically, a semiconductor wafer 206 with patterned circuit structures 211 is held by a particle blasting tool 200 (106). Before particles are blasted at the wafer, the method selects the particles to have a size equal to or less than 3 microns (108). The particles can, for example, comprise aluminum oxide, silicon oxide, cerium, and/or a plastic. The method directs particles 209 in a stream 208 toward the patterned structures 211 (110) such that the particles 209 contact (strike, blast, etc.) the patterned structures 211 with a predetermined velocity sufficient to remove the patterned structures 211. The particles 209 are directed toward the wafer surface 210 using some high velocity device, such as a compressed air stream, to blast the wafer. This process of directing the particles at the wafer surface 210 is controlled to stop when substantially all of the patterned structures 211 are removed from the wafer surface 210 (106).

As discussed in U.S. patent application Ser. No. 11/609,573, the above-described particle blasting technique (at process 110) can be used to remove substantially all of the patterned circuit structures 211 from the surface 210 of a previously processed semiconductor wafer 206 and it can do so in such a way that the resulting semiconductor wafer is relatively smooth and does not exhibit a highly stressed lattice and/or a fragile nature. Furthermore, even if some structures or partial structures remain on the wafer, such structures are random and do not disclose any of the previously existing patterns (i.e., they do not disclose proprietary information). Thus, in some cases, after substantially all of the patterned circuit structures 211 are removed from the wafer surface 210 by particle blasting (at process 110), processing can stop and the semiconductor wafer 206 can be made immediately available as a recycled wafer upon which structures and layers can be formed (114).

Alternatively, in another embodiment of the invention, as disclosed herein, after substantially all of the patterned circuit structures 211 are removed from the wafer surface 210 by particle blasting (at process 110), a determination can be made regarding whether or not the resulting semiconductor wafer 206 requires additional processing, for example, to remove any remaining circuit structures 211, to repair/remove any lattice damage and/or to achieve a desired surface smoothness (112). If so, one or more optional grinding processes can be used to remove any remaining circuit structures 211, to repair/remove any lattice damage and/or to achieve at least a first level of desired surface smoothness (116). For example, a coarse grinding process can be performed on the wafer surface 210 to remove any remaining circuit structures 211. Alternatively, or in addition to the coarse grinding process, a fine grinding process can be performed on the wafer surface 210. This fine grinding can be performed so to remove any remaining circuit structures or to remove any lattice damage that may have resulted from coarse grinding or from particle blasting (at process 110, i.e., from the process of directing particles at the patterned circuit structure on the wafer surface). This fine grinding can further be performed so that a desired surface smoothness is achieved. That is, the fine grinding can be performed until the maximum roughness height of the wafer surface 210 does not exceed a predetermined value (e.g., approximately 80 nanometers).

Alternatively, or in addition to the one or more grinding processes, a polishing process can be performed (118). In an exemplary polishing process, a chemical mechanical polishing (CMP) apparatus with a polishing wheel can be used. A slurry containing an abrasive material (e.g., silicon dioxide) is added to the space between the semiconductor wafer and the polishing wheel. A basic solution (e.g., a solution having a pH value of approximately ten) is also added to this space. In operation, the abrasive material removes material from the surface 210 of the semiconductor wafer 206 and the basic material helps dissolve the removed material. This polishing process can be performed so that a desired smoothness is achieved. That is, the polishing process can be performed until the maximum roughness height of the wafer surface 210 does not exceed a predetermined value (e.g., approximately 10 nanometers). Due to the nature of polishing over grinding, polishing processes can be used to achieve greater levels of smoothness. Thus, if a combination of fine grinding and polishing processes are used, then the fine grinding can be performed until the maximum roughness of the wafer surface does not exceed a predetermined first value and the polishing can be performed, after the fine grinding, so that the maximum roughness does not exceed a predetermined second value that is less than the first value.

Following the optional grinding and/or polishing processes (116-118), the semiconductor wafer 206 can be made available as a recycled wafer and, for example, shipped to vendors for rework. Alternatively, prior to making the semiconductor wafer 206 available as a recycled wafer, optional cleaning and/or anneal processes can be performed (120).

The above-described grinding, polishing, cleaning and anneal processes (116-120) can be performed in a similar manner as described in detail in U.S. patent application Ser. No. 11/623,354, which discloses a method for removing a dopant layer (as opposed to patterned circuit structures) from the surface of a semiconductor wafer by performing grinding and/or polishing techniques so as to allow recycling of the semiconductor wafer.

Figure 3:
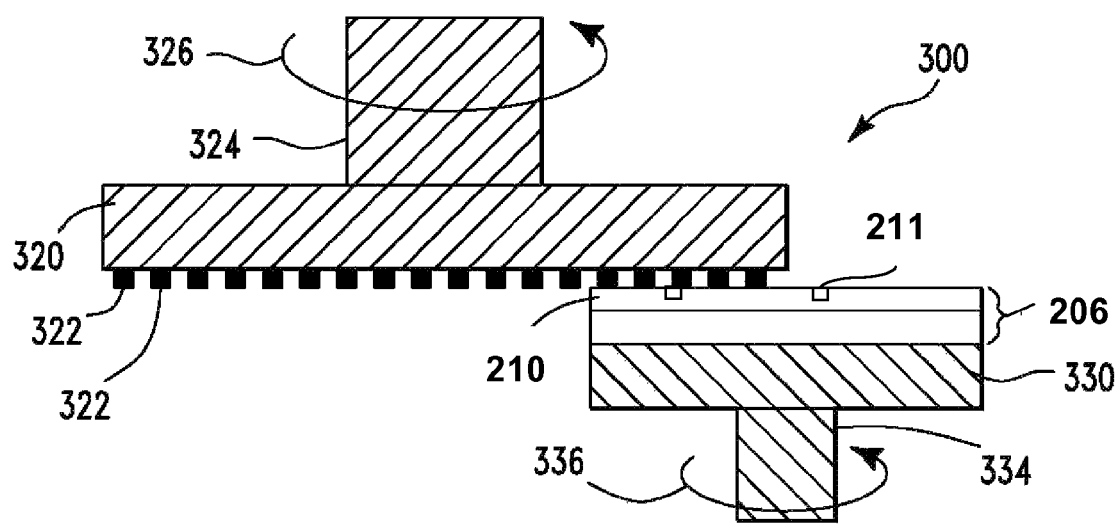
FIG. 3 is cross-section view diagram illustrating an exemplary grinding tool that can be used to perform process 116 of FIG. 1.

More specifically, as mentioned above, coarse grinding can optionally be performed (at process 116) on the wafer surface 210 to remove any remaining circuit structures 211. An exemplary coarse grinding process that may be incorporated into the method of the present invention is described in U.S. patent application Ser. No. 11/623,354. Specifically, FIG. 3 shows a cross-section view of an exemplary coarse grinding tool 300 which may be used to perform this process. The coarse grinding tool 300 comprises a coarse grinding wheel 320 and a chuck 330 below the coarse grinding wheel 320. The coarse grinding wheel 320 can contain diamond particles 322 of specific dimensions held to the coarse grinding wheel 320 by a bonding material such as epoxy or ceramic (not shown). The semiconductor wafer 206 can be physically attached to the chuck 330 such that the non-patterned side of the wafer 206 (i.e., the side of the semiconductor wafer 206 which did not have patterned circuit structures 211 prior to process (104)) is in direct physical contact with the top surface of the chuck 330. The coarse grinding tool 300 can further comprise a rotary driving unit 324 connected to the coarse grinding wheel 320 and a rotary driving unit 334 connected to the chuck 330. The rotary driving unit 324 can be adapted to rotate in a direction indicated by arrow 326 resulting in the coarse grinding wheel 320 rotating in the same direction. Alternatively, the rotary driving unit 334 can be adapted to rotate in a direction indicated by arrow 336 resulting in the chuck 330 rotating in the same direction. In operation, the coarse grinding wheel 320 comes down on the top surface 210 of the semiconductor wafer 206 such that the diamond particles 322 of the coarse grinding wheel 320 are in direct physical contact with the top surface 210 of the semiconductor wafer 206, when the grinding wheel 320 is rotated. Thus, rotation of the grinding wheel/chuck results in the semiconductor wafer 206 being thinned and can be performed until any circuit structures 211 remaining on the wafer surface 210 after blasting (at process 110) are removed from the wafer surface 210.

Also, as mentioned above, fine grinding can optionally be performed (at process 116) on the top surface 210 of the semiconductor wafer 206 in order to remove any remaining circuit structures 211 and to remove any lattice damage that may have resulted from coarse grinding (at process 116) or from particle blasting (at process 110). An exemplary fine grinding process that may be incorporated into the method of the present invention is described in U.S. patent application Ser. No. 11/623,354. Specifically, this fine grinding process can be performed using a fine grinding tool (not shown) which is similar to the coarse grinding tool 300 of FIG. 3 except that the dimensions of the diamond particles 322 in the fine grinding tool are smaller than the dimensions of the diamond particles 322 in the coarse grinding tool 300. Operation of the fine grinding tool can be similar to operation of the coarse grinding tool 300. As mentioned above, the fine grinding process helps remove silicon lattice damage at top surface 210 of the semiconductor wafer 206 created by the coarse grinding process and/or the blasting process.

Figure 4:
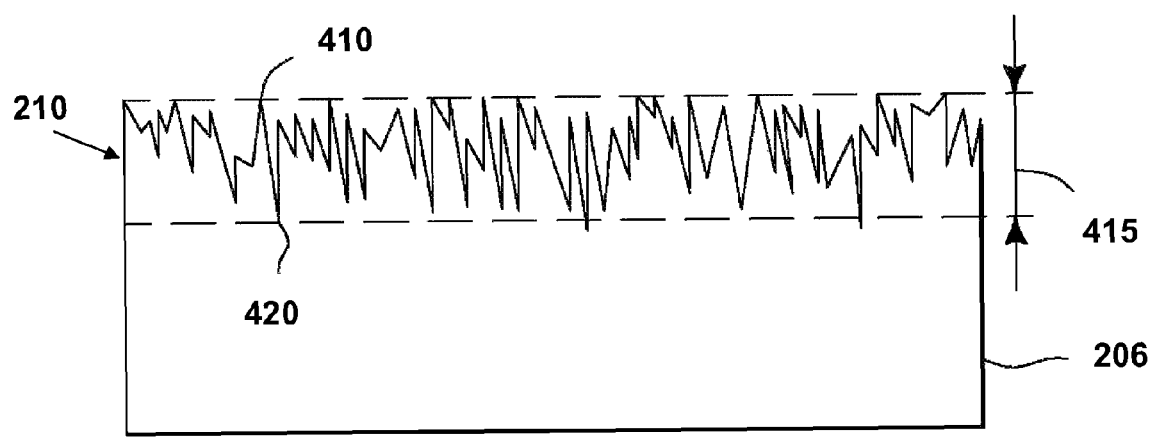
FIG. 4 is a cross-section view of an exemplary semiconductor wafer following performance of process 116 of FIG. 1.

As mentioned above, fine grinding (at process 116) can also be performed so that a desired surface smoothness is achieved. For example, FIG. 4 shows a cross-section view of the semiconductor wafer 206 after fine grinding is performed (at process 116). To achieve the desired smoothness, fine grinding can be performed until the surface 210 of the wafer 206 has a maximum roughness height 415 (also called Rmax 415), which does not exceed a predetermined value (e.g., approximately 77 nanometers). Rmax 415 being defined as the maximum vertical distance between a peak 410 and valley 420 on the top surface 210 of the semiconductor wafer 206. As a result of fine grinding, the semiconductor wafer 206 will have a relatively smooth top surface 210.

Figure 5:
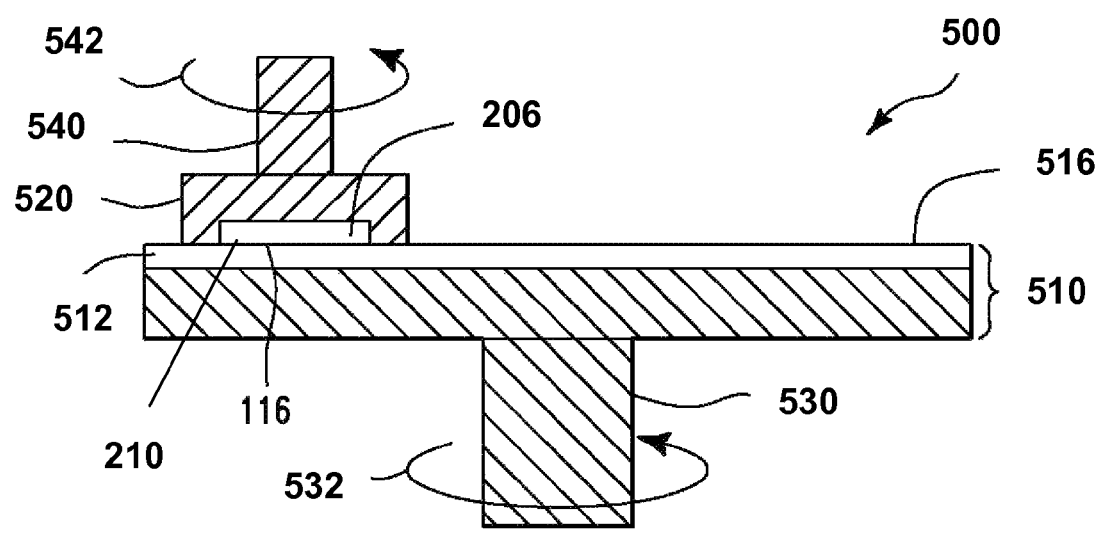
FIG. 5 is a cross-section view of an exemplary chemical mechanical polishing (CMP) apparatus that can be used to perform process 118 of FIG. 1.

Next, as mentioned above, the top surface 210 of the semiconductor wafer 206 can optionally be polished by a chemical mechanical polishing (CMP) process using a CMP apparatus (at process 118). An exemplary polishing process that may be incorporated into the method of the present invention is described in U.S. patent application Ser. No. 11/623,354. Specifically, FIG. 5 is a diagram illustrating an exemplary CMP apparatus that can be used to polish the wafer (at process 110). The CMP apparatus 500 can comprise a polishing wheel 510 and a chuck 520. The polishing wheel 510 comprises a polishing pad 512 which is generally a planar pad made from a continuous phase matrix material such as polyurethane. The semiconductor wafer 206 is physically attached to the chuck 520 such that the top surface 210 of the semiconductor wafer 206 is in direct physical contact with the top surface 516 of the polishing pad 512. The CMP apparatus 500 can further comprise a rotary driving unit 530 connected to the polishing wheel 510 and a rotary driving unit 540 connected to the chuck 520. The rotary driving unit 530 can be adapted to rotate in a direction indicated by arrow 532 resulting in the polishing wheel 510 rotating in the same direction. Alternatively, the rotary driving unit 540 can be adapted to rotate in a direction indicated by arrow 542 resulting in the chuck 520 rotating in the same direction.

In operation, the chuck 520 comes down on the top surface 516 of the polishing pad 512 such that the entire top surface 210 of the semiconductor wafer 206 is in direct physical contact with the top surface 516 of the polishing pad 512. Additionally, a slurry and a basic solution (not shown) are dripped onto the top surface 516 of the polishing pad 512 and are thereby dispensed through the interface between the top surface 516 of the polishing pad 512 and the top surface 210 of the semiconductor wafer 206. The slurry can contain abrasive particles made of material such as silicon dioxide. Then, the top surface 210 of the semiconductor wafer 206 is polished by the action of the polishing pad 512, the semiconductor wafer 206, and the basic solution and the slurry disposed there between. The basic solution helps dissolve silicon on top surface 210 of the semiconductor wafer 206. This is to ensure that the top surface 210 of the semiconductor wafer 206 is clean and has no residue left after this CMP process is performed. In one embodiment, the basic solution has a pH value of about ten.

Figure 6:
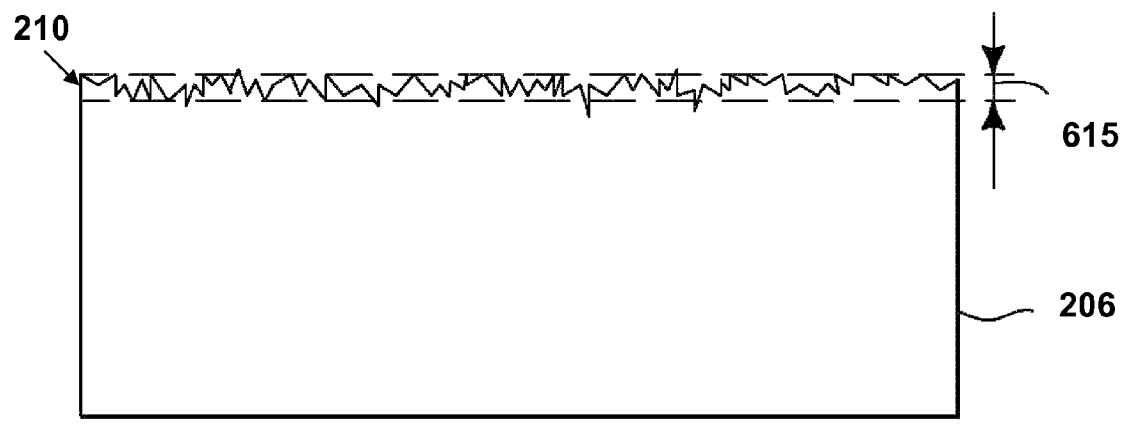
FIG. 6 is a cross-section view of an exemplary semiconductor wafer following performance of process 118 of FIG. 1.

As mentioned above, polishing (at process 118) can be performed so that a desired surface smoothness is achieved. For example, FIG. 6 shows a cross-section view of the semiconductor wafer 206 after polishing is performed (at process 110). To achieve the desired surface smoothness, polishing (at process 118) can be performed until the surface 210 of the wafer 206 has a maximum roughness height 615 (also called Rmax 615), which does not exceed a predetermined value (e.g., approximately 8.7 nanometers). Due to the nature of polishing over grinding, the Rmax 615 following polishing (at process 118) can be significantly less than the Rmax 415 following fine grinding (at process 116).

As mentioned above, prior to making the semiconductor wafer 206 available as a recycled wafer, optional cleaning and/or anneal processes can be performed (120). Exemplary cleaning and anneal processes that may be incorporated into the method of the present invention are described in U.S. patent application Ser. No. 11/623,354. Specifically, the top surface 210 of the semiconductor wafer 206 can be cleaned using a Huang A solution ($NH_4OH/H_2O_2/H_2O$) and/or a Huang B solution ($HCl/H_2O_2/H_2O$). More specifically, the Huang A solution can remove organic materials, whereas the Huang B solution can remove metallic materials. It should be noted that the Huang A and/or Huang B solutions remove the organic and metallic materials without affecting silicon lattice of the semiconductor wafer 206 Alternatively, or in addition to the above-described cleaning process, the semiconductor wafer 206 can also optionally be annealed using a conventional method (e.g., rapid thermal anneal (RTA)).

Therefore, disclosed herein are embodiments of a method of removing patterned circuit structures from the surface of a semiconductor wafer. The method embodiments comprise blasting the surface of the semiconductor wafer with particles so as to remove substantially all of the patterned circuit structures. The blasting process is followed by one or more grinding, polishing and/or cleaning processes to remove any remaining circuit structures, to remove any lattice damage resulting from grinding and/or particle blasting, and/or to achieve a desired smoothness across the surface of the semiconductor wafer. The method embodiments disclosed herein produce a recycled semiconductor wafer product that has improved lattice properties, uniformity and smoothness over recycled semiconductor wafer products produced using, for example, wet bath removal, layer-by-layer removal and particle blasting removal alone.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims.

What is claimed is:

1. A method of removing patterned circuit structures from semiconductor wafers, said method comprising:
    providing a semiconductor wafer having a surface with patterned circuit structures;
    directing particles through a nozzle at said patterned circuit structures on said surface such that said particles contact said patterned circuit structures with a predetermined velocity sufficient to remove said patterned circuit structures, said particles having a size equal to or less than 3 microns;
    controlling said directing of said particles so as to stop said directing when substantially all of said patterned circuit structures are removed from said surface of said wafer; and
    after said directing, polishing to smoothen said surface.

2. The method according to claim 1, said particles comprise at least one of aluminum oxide, silicon oxide, cerium, and a plastic.

3. The method according to claim 1, said method further comprising, before said providing of said semiconductor wafer, using said semiconductor wafer as a manufacturing control tool.

4. The method according to claim 1, said polishing comprising: using a chemical mechanical polishing apparatus; and, adding a slurry containing an abrasive material to a space between said semiconductor wafer and a polishing wheel of said chemical mechanical polishing apparatus.

5. The method according to claim 1, said polishing comprising: using a chemical mechanical polishing apparatus; and adding a basic solution to a space between said semiconductor wafer and a polishing wheel of said chemical mechanical polishing apparatus.

6. The method according to claim 5, said basic solution having a pH value of approximately ten.

7. The method according to claim 1, said polishing comprising performing said polishing until a maximum roughness height of said surface does not exceed a predetermined value.

8. A method of removing patterned circuit structures from semiconductor wafers, said method comprising:
    providing a semiconductor wafer having a surface with patterned circuit structures;
    directing particles through a nozzle at said patterned circuit structures on said surface such that said particles contact said patterned circuit structures with a predetermined velocity sufficient to remove said patterned circuit structures, said particles having a size equal to or less than 3 microns;
    controlling said directing of said particles so as to stop said directing when substantially all of said patterned circuit structures are removed from said surface of said wafer; and
    after said directing, grinding said surface.

9. The method according to claim 8, said particles comprising at least one of aluminum oxide, silicon oxide, cerium, and a plastic.

10. The method according to claim 8, said method further comprising, before said providing of said semiconductor wafer, using said semiconductor wafer as a manufacturing control tool.

11. The method according to claim 8, said grinding comprising fine grinding said surface so as to remove any lattice damage resulting from said directing of said particles.

12. The method according to claim 11, said fine grinding of said surface comprising performing said fine grinding until a maximum roughness height of said surface does not exceed a predetermined value.

13. A method of removing patterned circuit structures from semiconductor wafers, said method comprising:
    providing a semiconductor wafer having a surface with patterned circuit structures;
    directing particles through a nozzle at said patterned circuit structures on said surface such that said particles contact said patterned circuit structures with a predetermined velocity sufficient to remove said patterned circuit structures, said particles having a size equal to or less than 3 microns;
    controlling said directing of said particles so as to stop said directing when substantially all of said patterned circuit structures are removed from said surface of said wafer; and
    after said directing, grinding said surface; and
    after said grinding, polishing said surface.

14. The method according to claim 13, said particles comprising at least one of aluminum oxide, silicon oxide, cerium, and a plastic.

15. The method according to claim 13, said method further comprising, before said providing of said semiconductor wafer, using said semiconductor wafer as a manufacturing control tool.

16. The method according to claim 13, said polishing comprising: using a chemical mechanical polishing apparatus; and, adding a slurry containing an abrasive material to a space between said semiconductor wafer and a polishing wheel of said chemical mechanical polishing apparatus.

17. The method according to claim 13, said polishing comprising: using a chemical mechanical polishing apparatus; and adding a basic solution to a space between said semiconductor wafer and a polishing wheel of said chemical mechanical polishing apparatus.

18. The method according to claim 17, said basic solution having a pH value of approximately ten.

19. The method according to claim 13, said grinding comprising fine grinding said surface so as to remove any lattice damage resulting from said directing of said particles.

20. The method according to claim 13, said fine grinding of said surface comprising performing said fine grinding until a maximum roughness height of said surface does not exceed a predetermined first value, and said polishing comprising performing said polishing until said maximum roughness height of said surface does not exceed a predetermined second value less than said predetermined first value.

* * * * *